United States Patent [19]
Itagaki

[11] Patent Number: 5,389,573
[45] Date of Patent: Feb. 14, 1995

[54] METHOD OF MAKING NARROW METAL ELECTRODE

[75] Inventor: Takushi Itagaki, Itami, Japan

[73] Assignee: Mitsubishi Denki Kabushiki Kaisha, Tokyo, Japan

[21] Appl. No.: 215,478

[22] Filed: Mar. 21, 1994

Related U.S. Application Data

[62] Division of Ser. No. 948,441, Sep. 22, 1992, Pat. No. 5,328,520.

[30] Foreign Application Priority Data

Feb. 24, 1992 [JP] Japan .................. 4-75308

[51] Int. Cl.$^6$ .......................... H01L 31/18
[52] U.S. Cl. ...................... 437/180; 437/2; 437/181; 427/286
[58] Field of Search ............... 437/2-5, 437/180-181; 136/256; 427/75, 96, 197, 286

[56] References Cited

U.S. PATENT DOCUMENTS

| | | | |
|---|---|---|---|
| 4,320,250 | 3/1982 | Corwin et al. | 136/256 |
| 4,511,600 | 4/1985 | Leas | 427/75 |
| 4,694,115 | 9/1987 | Lillington et al. | 136/256 |
| 5,151,377 | 9/1992 | Hanoka et al. | 437/2 |

FOREIGN PATENT DOCUMENTS

| | | | |
|---|---|---|---|
| 0186351 | 7/1986 | European Pat. Off. | 136/256 |
| 2318053 | 11/1973 | Germany | 136/256 |
| 3619311 | 10/1987 | Germany | 136/244 |
| 61-166126 | 7/1986 | Japan | 437/180 |
| 64-39076 | 2/1989 | Japan | 136/256 |
| 64-39078 | 2/1989 | Japan . | |
| 1039079 | 2/1989 | Japan . | |

OTHER PUBLICATIONS

Therez et al, "AlGaAs–GaAs Solar Cell Development: Electrical Analysis And Prospects For Space Application", Solar Cells, vol. 18, 1986, pp. 163–170.

Baert et al, "Characterization of Screenprinted Contacts on a-Si:H Solar Cells with a Micro C-Si Top Layer", 8th E.C. Photovoltaic Solar Energy Conference, (May 1988), pp. 949–952.

Mathias, "Additive Direct Writing: An Emerging Technology", Micropen, Inc., Pittsford, N.Y. 14534 Publication Date Unavailable.

Micropen Product Literature Publication Date Unavailable.

Micropen Direct Writing and Precision Dispensing System Publication Date Unavailable.

Lawrence, "Thick Film Conductive Ink Contacts For Concentrator Cells", Conference Record, 14th IEEE Photovoltaic Specialists Conference, 1980, pp. 541–544.

Blakers et al, "Fabrication Of Thick Narrow Electrodes On Concentrator Solar Cells", Journal of Vacuum Science, vol. 20, No. 1, 1982, pp. 13–15.

*Primary Examiner*—Aaron Weisstuch
*Attorney, Agent, or Firm*—Leydig, Voit & Mayer

[57] ABSTRACT

A method for producing a linear pattern having a width less than 100 microns and a resistivity of the order of $10^{-6}$ Ω·cm on a substrate includes maintaining a low melting point metal in a fused state, applying the fused metal to a tip of a drawing head disposed close to or in contact with a substrate by capillary action, applying the fused metal to the substrate in a line with a width less than 100 microns while moving the tip of the drawing head relative to the substrate, and cooling and solidifying the fused metal as a linear pattern on the substrate.

5 Claims, 7 Drawing Sheets

F I G. 3 (a)
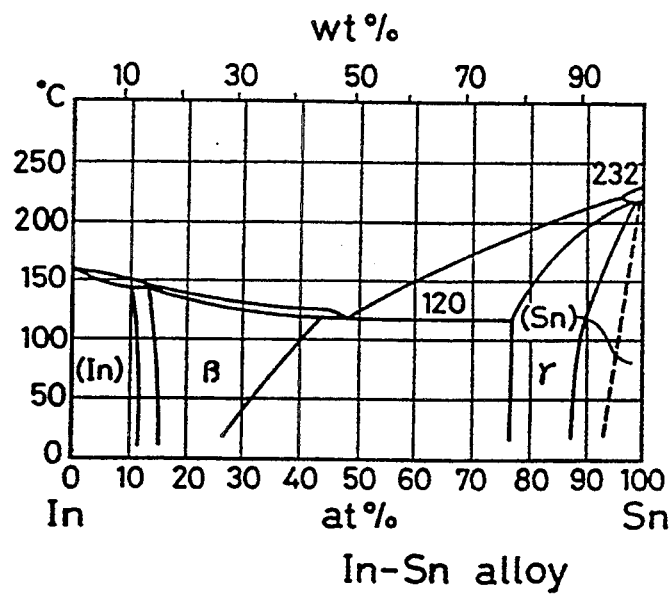
In-Sn alloy
F I G. 3 (b)
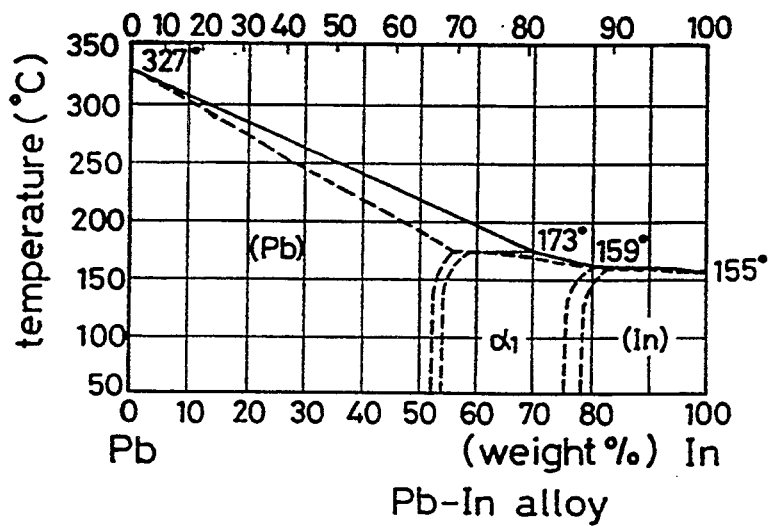
Pb-In alloy

METHOD OF MAKING NARROW METAL ELECTRODE

This disclosure is a division of application Ser. No. 07/948,441, filed Sep. 22, 1992, now U.S. Pat. No. 5,328,520.

FIELD OF THE INVENTION

The present invention relates to a method of and an apparatus for producing a linear pattern having a width of 100 microns or less and a resistivity of the order of $10^{-6}$ $\Omega$·cm. The present invention also relates to a solar cell.

BACKGROUND OF THE INVENTION

FIG. 9 is a cross-sectional view schematically showing a conventional solar cell. In FIG. 9, an active layer of the solar cell 500 comprises an n type Si layer 51 and a p type Si layer 52. A p side electrode 53 comprising a linear pattern is disposed on the p type Si layer 52 and an n side electrode 54 is disposed on the rear surface of the n type Si layer 51.

As a method for forming an electrode of such a conventional solar cell, vapor deposition or sputtering, screen printing, drawing-printing, or the like has been employed. In addition, an Ag paste has been employed as an electrode material of the conventional solar cell. Recently, a low temperature baking Ag paste whose baking temperature is only 150°~180° C. has come to be used. If a high temperature baking Ag paste whose baking temperature is 700°~800° C. is used for forming an electrode of an amorphous silicon solar cell or a microcrystalline silicon/crystalline silicon junction-type solar cell, the junction in an active layer of the solar cell is damaged during the baking process.

Meanwhile, in the above-described screen printing method, an AG paste comprising AG powder, Glass frit, and an organic binder is printed on a substrate through a print mask comprising a stainless mesh on which an emulsion pattern is formed and then it is dried and baked to form an electrode pattern having a desired resistivity. However, the minimum width of the electrode formed by this method is 100~150 microns and an electrode narrower than that cannot be formed. If the electrode 53 on the light receiving surface of the solar cell 500 shown in FIG. 9 is formed by this screen printing method, the width of the electrode 53 exceeds 100 microns, thereby decreasing the effective power generating area 55 of the incident light surface. In addition, when the electrode pattern is changed, a new screen mask is needed, resulting in a poor production yield.

Meanwhile, FIG. 8 is a schematic diagram showing a method for applying a paste on a substrate using a drawing-printing apparatus disclosed in Japanese Patent Published Application No. 64-39078. In the drawing-printing method, a tank 10 is filled with paste 13 and kept warm by constant-temperature water 14 circulating around the tank 10. The constant-temperature water 14 is sent from a constant-temperature tank 15 by a pump 17. The paste 13 is compressed by a float 12, to which air pressure 11 is applied, and discharged through a nozzle 18, and a desired pattern is drawn on a substrate 16. This method solves the problems in the conventional screen printing method. However, when a linear pattern having a width below 100 microns is drawn by this method using the low temperature baking Ag paste and then it is baked at 150°~180° C. to form an electrode pattern of an amorphous silicon solar cell or a microcrystalline silicon/crystalline silicon junction type solar cell, the resistivity of the electrode pattern is higher than $5 \times 10^{-5}$ $\Omega$·cm, so that current generated in the cell is not efficiently taken out, adversely affecting the characteristics of the solar cell.

Furthermore, since above-described screen printing method and drawing-printing method use a paste, a step of baking the paste is required after forming the pattern, and the baking step takes a lot of time. Therefore, the pattern is not formed with high efficiency. In addition, when a high temperature baking paste is used, there is a sudden change of temperature between the baking step and a cooling step after the baking, so that the substrate, on which the pattern is formed, is unfavorably deformed by the temperature change.

SUMMARY OF THE INVENTION

It is an object of the present invention to provide a method of and an apparatus for producing a linear pattern having a width below 100 microns and a resistivity of the order of $10^{-6}$ $\Omega$·cm at a temperature lower than 200° C. in a simple process.

It is another object of the present invention to provide a high-performance solar cell in which the effective power generating area is increased and the resistivity of an electrode is reduced.

It is still another object of the present invention to provide a high-performance solar cell in which the effective power generating area is increased, the resistivity of an electrode is reduced, and a junction in an active layer is not destroyed in a baking step.

Other objects and advantages of the present invention will become apparent from the detailed description given hereinafter; it should be understood, however, that the detailed description and specific embodiment are given by way of illustration only, since various changes and modifications within the spirit and scope of the invention will become apparent to those skilled in the art from this detailed description.

According to a first aspect of the present invention, in a method for producing a linear pattern, a low melting point metal is kept in its fused state, the fused metal is applied to a tip of a drawing head, which contacts a surface of a substrate, by capillary action. The fused metal is applied to the substrate in a line narrower than 100 microns while moving the drawing head, and the linear pattern of fused metal is cooled and solidified spontaneously on the substrate. Thus, a linear pattern having a width below 100 microns and a resistivity of the order of $10^{-6}$ $\Omega$ cm is formed in a simple process with high efficiency.

According to a second aspect of the present invention, a low melting point metal whose melting point is below 200° C. is used. Therefore, when the above-described linear pattern is formed on an active layer comprising amorphous silicon or microcrystalline silicon of a solar cell as an electrode of the solar cell, the junction in the active layer is not destroyed.

According to a third aspect of the present invention, a pattern drawing unit comprises a tank for keeping a low melting point metal in its fused state and a drawing head, and at least one of the substrate and the pattern drawing unit is moved in a prescribed direction by computer control. Therefore, the pattern to be formed and the applying conditions of the fused metal are changed easily and rapidly by the program stored in the computer.

According to a fourth aspect of the present invention, an electrode disposed on an incident light surface of an active layer of a solar cell comprises a linear pattern having a width below 100 microns and a resistivity of the order of $10^{-6}$ Ω·cm. Therefore, the effective power generating area of the solar cell increases and the current generated in the active layer is taken out with high efficiency.

BRIEF DESCRIPTION OF THE DRAWINGS

FIGS. 3(a) and 3(b) are diagrams each showing a relation between a composition ratio and a melting point of an indium alloy;

DETAILED DESCRIPTION OF THE PREFERRED EMBODIMENTS

Figure 1:
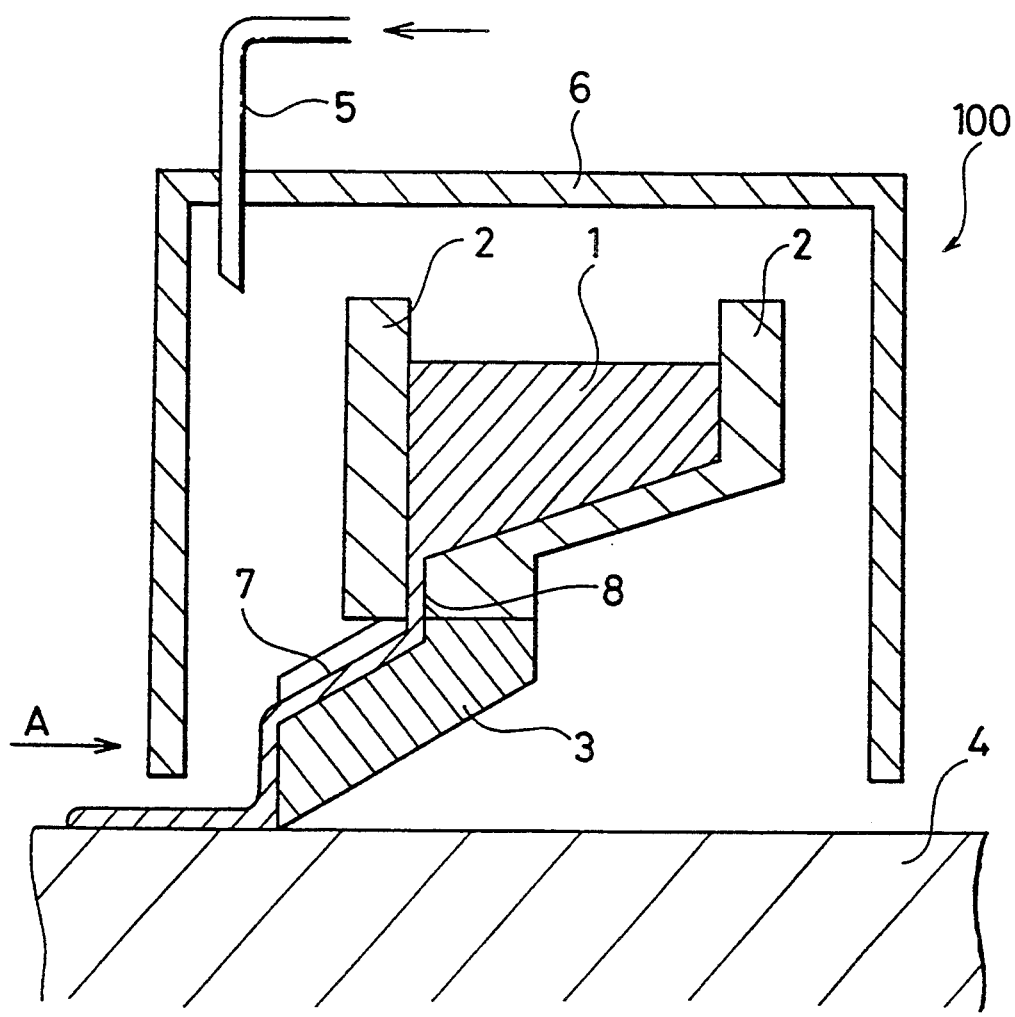
FIG. 1 is a cross-sectional view schematically illustrating an apparatus for producing a linear pattern in accordance with a first embodiment of the present invention.
Figure 2:
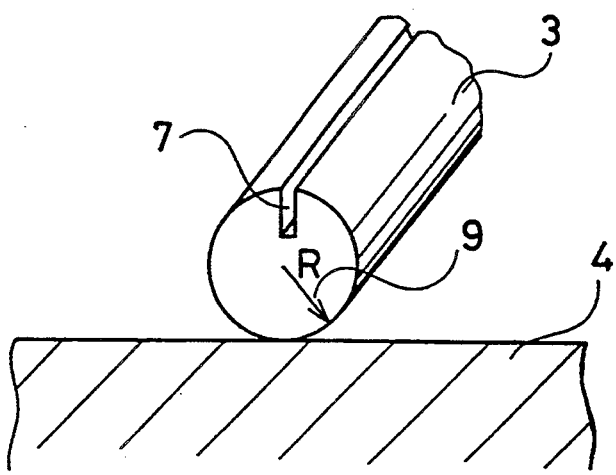
FIG. 2 is a perspective view schematically illustrating a tip of a drawing head shown in FIG. 1.

FIG. 1 is a cross-sectional view schematically showing a structure of an apparatus for producing a linear pattern in accordance with a first embodiment of the present invention. In FIG. 1, reference numeral 100 designates an apparatus for producing a linear pattern. The apparatus 100 comprises a tank 2 filled with fused indium 1, drawing head 3 connected to the tank 2, a cover 6 covering the tank 2 and the drawing head 3, and a gas inlet 5 through which inert gas is introduced into a space inside the cover 6. In addition, reference numeral 4 designates a substrate on which a linear pattern is formed. Reference numerals 8 and 7 designate narrow grooves formed in the tank 2 and the drawing head 3, respectively. The tank 2 and the drawing head 3 are kept warm, at a prescribed temperature, so that the indium is kept in a melted state. FIG. 2 is a perspective view schematically showing a tip of the head 3. In FIG. 2, the tip of the head 3 is cylindrical in shape and has a radius of curvature R. In addition, the tank 2 and the drawing head 3 comprise a material keeping the indium in a fused state and making the indium penetrate through the grooves 7 and 8 by capillary action. Preferably, Fe, an alloy of Fe and another metal, or the like is used.

A description is given of a method for forming a linear pattern using the apparatus 100.

The fused indium 1 in the tank 2, whose melting point is 156.6° C., penetrates into the narrow grooves 8 and 7 by capillary action and flows in the grooves to reach the tip of the drawing head 3. In this state, since the drawing head 3 is also kept warm, the fused indium spreads over the end surface of the tip of the head by its surface tension. Thereafter, a part of the tip of the cylindrical head is brought into contact with the surface of the substrate 1, whereby the fused indium 1 is applied to the substrate 4. At this time, the fused indium 1 is adhered to the surface of the substrate 4 by the surface tension of the fused indium 1 and wettability of the substrate 4 by the fused indium 1. The width of the fused indium 1 applied in a line is controlled by the surface tension of the fused indium, the wettability of the substrate by the fused indium, moving speed of the head 3, the radius of curvature R of the end surface of the head 3, and the like. By adjusting these conditions in prescribed ranges, the fused indium 1 is applied to the substrate 4 in a line narrower than 100 microns with high precision. The fused indium on the substrate 4 is cooled because heat from the fused indium is absorbed by the substrate 4, whereby it is solidified maintaining the same shape as applied, resulting in a linear pattern having a width below 100 microns and a resistivity of $8 \times 10^{-6}$ Ω·cm. In the process steps, since the space inside the cover 6 is filled with inert gas, the fused indium 1 is not oxidized while it is being applied to the substrate and solidified, and no oxidizing sludge is generated in the grooves 7 and 8 or on the tip of the head 3. Therefore, the path from the tank 2 to the tip of the drawing head 3 is not blocked by the fused indium, and breakage of the pattern, variation in the width of the pattern, and the like are avoided.

While in the above-described first embodiment the apparatus has only one drawing head 3, it may have a plurality of drawing heads. In this case, a plurality of linear patterns running parallel to each other are formed at the same time, whereby the time required for forming the pattern is reduced.

While in the above-described first embodiment the tip of the drawing head 3 contacts the surface of the substrate 4 when the fused indium 1 is applied to the substrate, it may be positioned very close to but spaced from the surface of the substrate.

In addition, the low melting point metal is restricted to indium.

Figure 4:
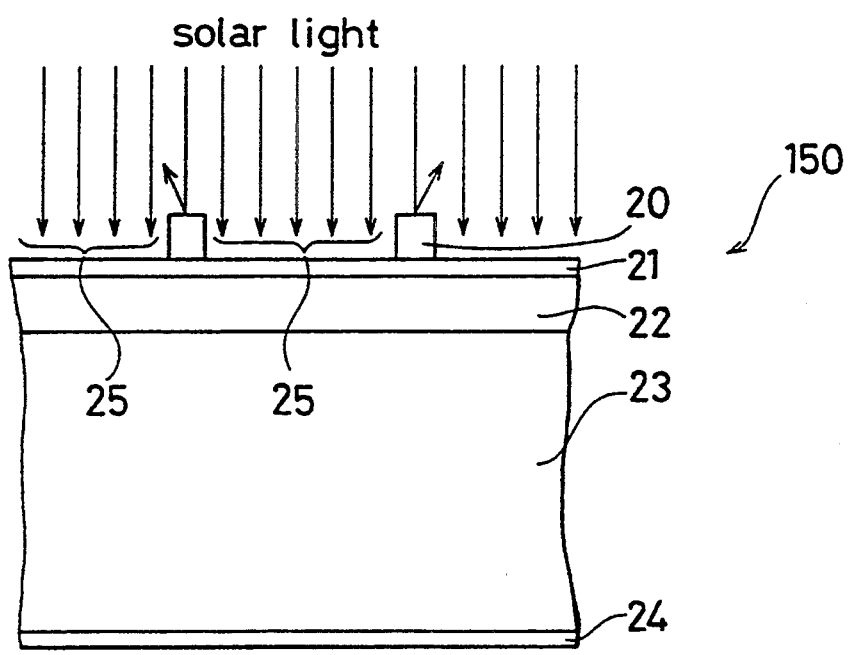
FIG. 4 is a cross-sectional view of a solar cell in accordance with a second embodiment of the present invention.

FIG. 4 is a cross-sectional view illustrating a microcrystalline silicon/crystalline silicon junction type solar cell in accordance with a second embodiment of the present invention. In FIG. 4, an active layer of the solar cell 150 comprises a p type microcrystalline silicon layer 22 and an n type crystalline silicon layer 23. A transparent electrode 21 comprising ITO or the like is disposed on the p type microcrystalline silicon layer 22. A p side electrode 20 comprising indium is disposed on the transparent electrode 21. An n side electrode 24 comprising aluminum or the like is disposed on the rear surface of the n type crystalline silicon layer 23.

In this second embodiment, a linear pattern comprising indium and having a width below 100 microns is formed on the incident light surface of the active layer, i.e., the transparent electrode 21 using the apparatus shown in FIG. 1, whereby the p side electrode 20 is produced. Therefore, the transparent electrode 21 is not heated beyond the melting point of indium, i.e., 156.6° C., so that the active layer is not heated over the temperature and the p-n junction between the p type microcrystalline silicon layer 22 and the n type crystalline silicon layer 23 is not destroyed. In addition, since the width of the p side electrode is below 100 microns and the resistivity thereof is on the order of $10^{-6}$ Ω·cm, the effective power generating area 25 is increased, whereby power generation in the active layer is increased and generated current is taken out with high efficiency.

While in the above-described second embodiment indium is used as the low melting point metal, other metals having melting points below 200° C. may be used. In addition, indium-tin alloy, indium-lead alloy, or the like may be used so long as its composition ratio is selected so that its melting point is below 200° C.

Figure 6:
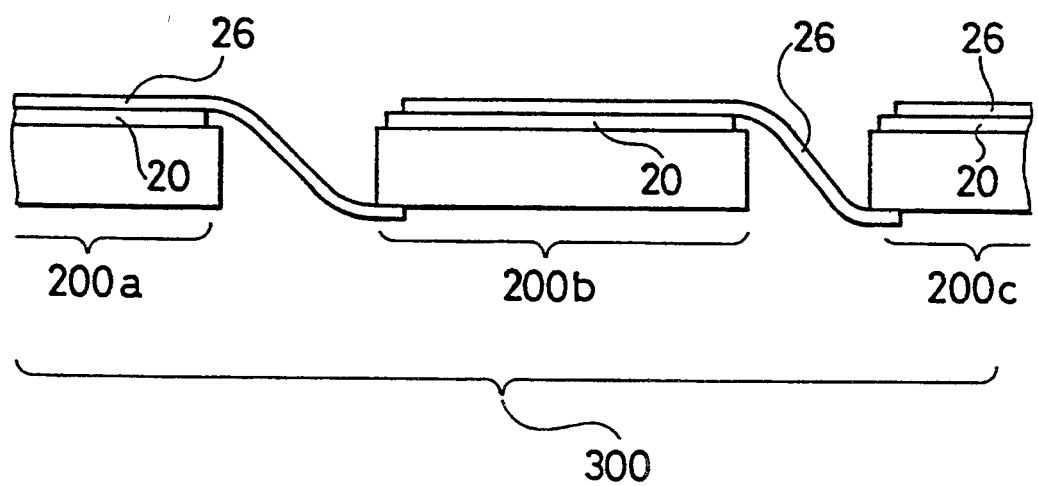
FIG. 6 is a cross-sectional view of a solar cell module in which a plurality of solar cells shown in FIG. 5 are connected to each other.

FIG. 6 is a schematic diagram illustrating a solar cell module in accordance with a third embodiment of the present invention. In FIG. 6, the solar cell module 300 comprises solar cells 200a, 200b, and 200c which are electrically connected to each other by Cu wires 26.

Figure 5:
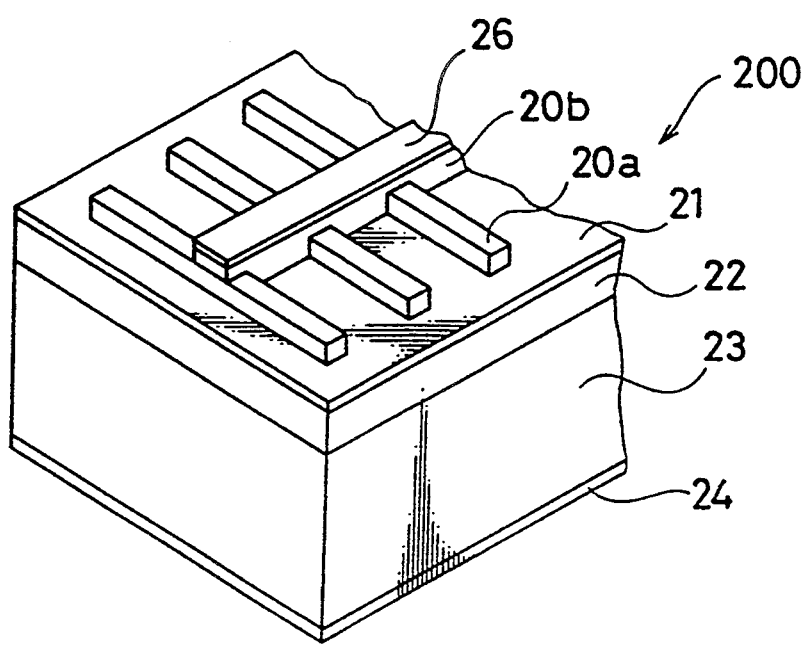
FIG. 5 is a perspective view of a solar cell in accordance with a third embodiment of the present invention.

FIG. 5 is a perspective view showing a structure of the solar cell 200a (200b, 200c) of FIG. 6 in more detail. In FIG. 5, the solar cell 200 is fundamentally identical to the solar cell 150 shown in FIG. 4 and the same reference numerals as in FIG. 4 designate the same or corresponding parts.

In the solar cell 200, an electrode disposed on the incident light surface of the active layer comprises a plurality of linear electrodes 20a running parallel to each other and a linear electrode 20b intersecting the electrodes 20a. The electrodes 20a comprise an indium alloy, such as an indium-tin alloy (In—Sn alloy) or an indium-lead alloy (Pb—In alloy), having a different melting point and different composition ratio from those of the indium alloy for the electrode 20b. More specifically, the melting point of the indium alloy for the electrode 20b is lower than the melting point of the indium alloy for the electrodes 20a. These electrodes 20a and 20b are formed in the same manner as described in the first embodiment using the apparatus of FIG. 1. The width of each electrode is below 100 microns. In addition, an end of a Cu wire 26 is connected to the electrode 20b conventionally with solder while the other end thereof is connected to an electrode on the rear surface of the adjacent cell as shown in FIG. 6. In addition, FIG. 3(a) shows the relationship between a composition ratio and melting point of the In—Sn alloy and FIG. 3(b) shows the relationship between a composition ratio and melting point of the Pb—In alloy. As shown in FIGS. 3(a) and 3(b), the melting points of these indium alloys can be varied in many ways without exceeding 200° C.

According to the third embodiment of the present invention, the indium alloy having higher a melting point is used for the linear electrodes 20a which are formed first on the active layer and the indium alloy having a lower melting point is used for the linear electrode 20b which is formed second. Therefore, when the electrode 20b is formed across the electrodes 20a, the electrodes 20a are not fused again, resulting in an improved electrode pattern with no breakage. In addition, since the melting points of the above-described indium alloys are lower than 2° C., a p-n junction inside the cell is not destroyed, preventing deterioration in the device characteristics.

When the Cu wire 26 is connected to the electrode 20b by soldering, the melting point of the solder should be lower than the melting point of the electrode 20b. In this case, a solder having a melting point lower than the melting point of the electrode 20b is chosen from conventional solders, such as Pb—Sn alloy, Pb—Ag alloy, Bi—Sn alloy, and the like, whereby breakage of the linear electrode 20b is avoided when the Cu wire 26 is connected thereto.

While in the above-illustrated third embodiment an indium alloy is used for the electrodes 20a and 20b, either of them may be formed of indium with the same effects as described above.

A description is given of a fourth embodiment of the present invention. The structure of a solar cell achieved by this fourth embodiment is identical to the solar cell shown in FIG. 4. When the p side electrode 20 comprising indium shown in FIG. 4 is formed, globular or flaky particles of metals, such as Ag, Au, Cu, Pt, or the like having a higher melting point and a lower resistivity than those of indium, are mixed into the fused indium. An average diameter of the particles should be 1–10 microns.

According to the fourth embodiment, the resistivity of the linear pattern is significantly reduced by the metal particles mixed into the low melting point metal, whereby the current density in the electrode increases as the volume of the linear pattern decreases, with the result that power loss is reduced and characteristics of the solar cell are significantly improved.

Figure 7:
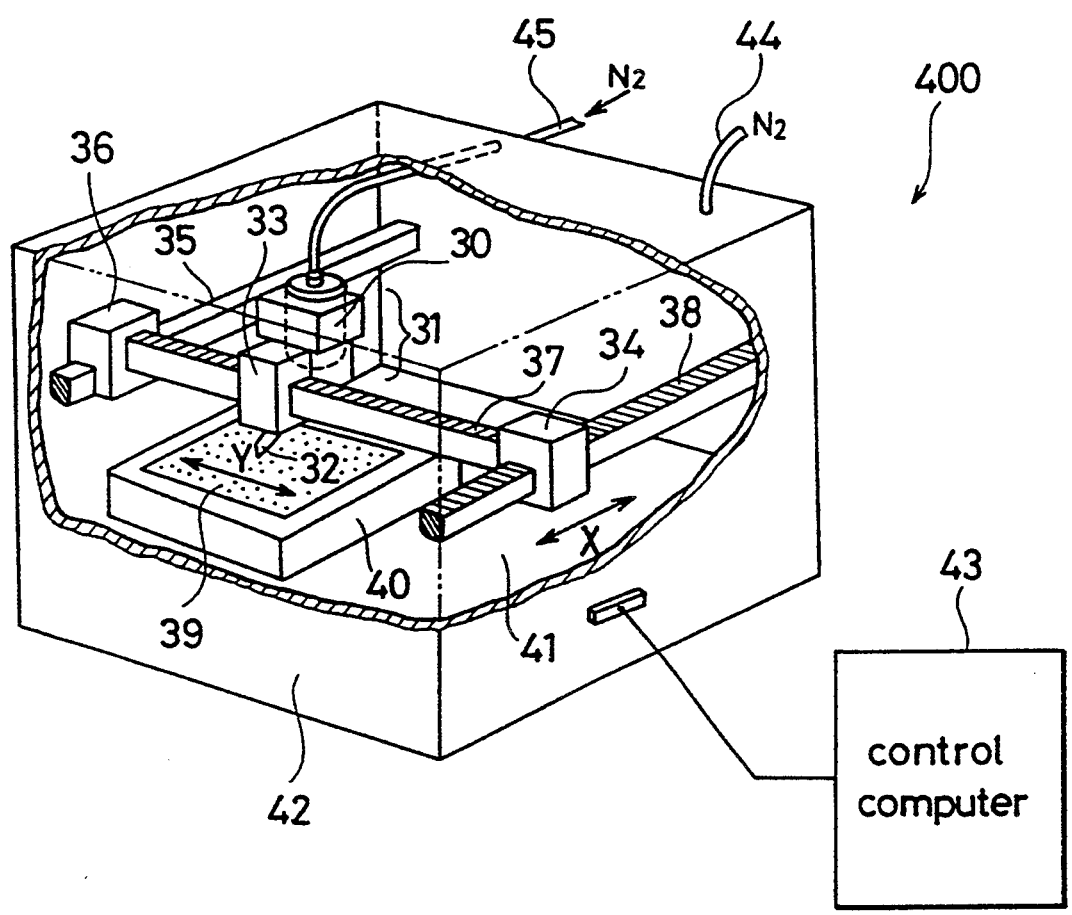
FIG. 7 is a perspective view of an apparatus for producing a linear pattern in accordance with a fifth embodiment of the present invention.
Figure 8:
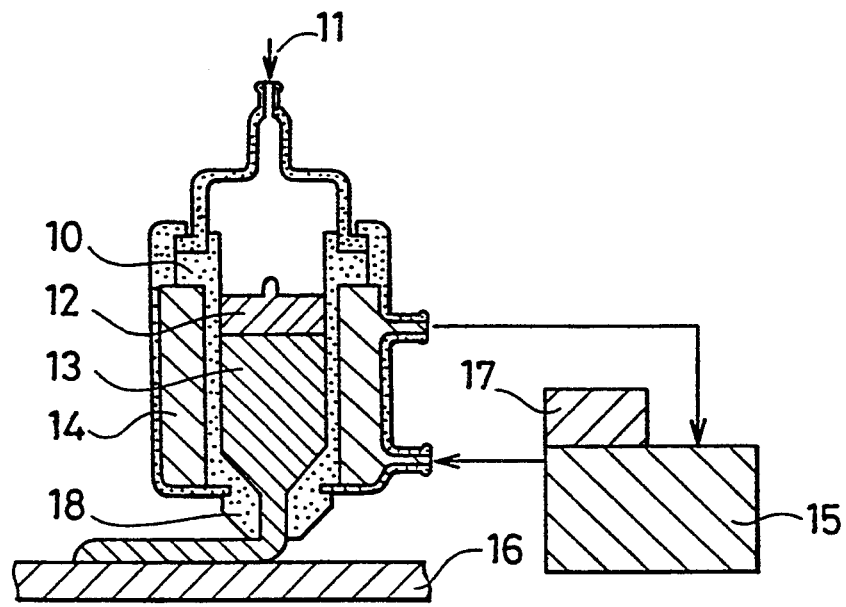
FIG. 8 is a cross-sectional view of a drawing-printing apparatus utilizing paste as a material of a pattern to be drawn, in accordance with the prior art.
Figure 9:
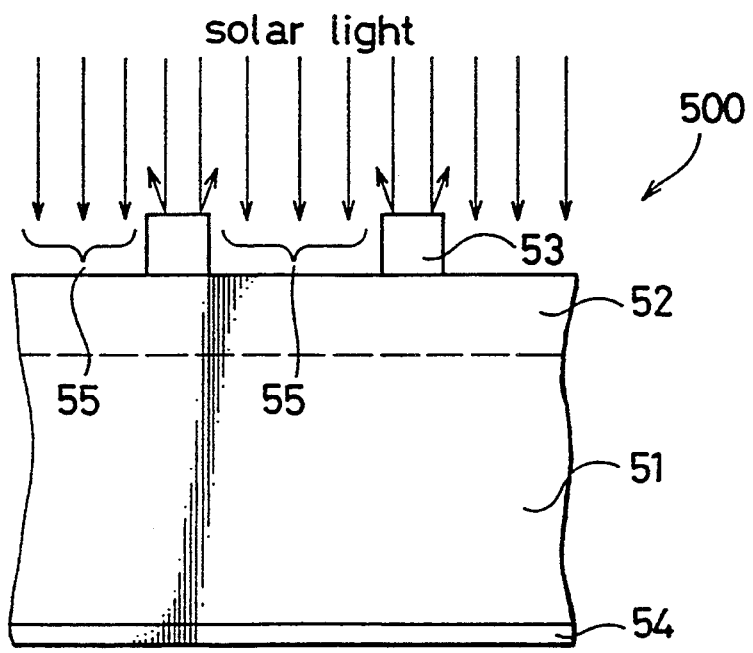
FIG. 9 is a cross-sectional view of a solar cell in accordance with the prior art.

FIG. 7 is a perspective view showing an apparatus for forming a linear pattern in accordance with a fifth embodiment of the present invention. In FIG. 7, a substrate 39, on which a linear pattern is formed, is put on a stage 40 disposed on a bottom plate 41 of the apparatus 400. A tank 30 is filled with low melting point metal, such as indium, and kept warm, at a prescribed temperature, to keep the metal in its fused state. The low melting point metal in the tank 30 is sent to a drawing head 32 by capillary action. The drawing head 32 is also kept warm, at a prescribed temperature. A pattern drawing unit 31 comprises the tank 30 and the drawing head 32. A Y direction drive motor 33 is fixed to the pattern drawing unit 31 and moves along a bar 37. A slidable member 36 is fixed to an end of the bar 37 and moves along a stay 35 which intersects the bar 37 at right angle. An X direction drive motor-34 is fixed to the opposite end of the bar 37 and moves along a bar 38 which intersects the bar 37 at a right angle. The Y direction drive motor 33 and the X direction drive motor 34 are controlled by a computer 43 from the outside. The structure of the drawing head 32 is fundamentally as same as the drawing head 3 shown in FIG. 2. The computer 43 controls the heating of the tank 30 and the drawing head 32. In addition, nitrogen gas is introduced into the tank 30 through a nitrogen gas inlet 45 to apply pressure to the fused metal in the tank 30, and the fused metal is applied to the drawing head 32 by capillary action. Nitrogen gas is also introduced into the box 42 through a nitrogen gas inlet 44.

According to the fifth embodiment of the present invention, the tank 30, filled with the low melting point metal, and the drawing head 32 are united as the pattern drawing unit 31, and the movement and the heating of the pattern drawing unit 31 are controlled in accordance with programs stored in the computer 43. Therefore, the pattern to be formed and the applying conditions of the fused metal are changed easily and rapidly, so that the production yield is improved when various kinds of linear patterns are formed in small quantities. In addition, the material of the pattern can be changed merely by replacing the pattern drawing unit 31, reducing the trouble of changing the material.

While in the above-described fifth embodiment a motion of the pattern drawing unit 31 is controlled by the computer 43, motion of the substrate 39 or motions of both the substrate 39 and the pattern drawing unit 31 may be controlled by the computer 43. Also in this case, the same effects as described above are achieved.

Although microcrystalline silicon/crystalline silicon junction type solar cells are described in the second, third, and fourth embodiments of the present invention, even in a case where a linear electrode is formed on an incident light surface of an amorphous silicon solar cell whose active layer comprises amorphous silicon, a junction in the active layer is not destroyed and the same effects as described in those embodiments are achieved.

In the above-described first to fifth embodiments of the present invention, the linear pattern is formed on the incident light surface of the active layer or on the surface of a transparent electrode disposed on the active layer. However, the method of and apparatus for producing a linear pattern of the present invention may be applied to formation of a circuit pattern on a printed or ceramic substrate. Also in this case, the same effects as described above are obtained. In addition, since there is no sudden change in the process temperature during the pattern formation, deformation of the printed or ceramic substrate is avoided.

As is evident from the foregoing description, according to the present invention, the low melting point metal is kept in its fused state, the fused metal is applied to the tip of the drawing head, which contacts a surface of the substrate, by capillary action, the fused metal is applied to the substrate in a line narrower than 100 microns while moving the drawing head, and the linear pattern of fused metal is cooled and solidified spontaneously on the substrate. In this method, formation of a screen mask and baking of the pattern on the substrate, which are required in the conventional methods, are dispensed with. Therefore, a linear pattern having a width below 100 microns and a resistivity of the order of $10^{-6}$ $\Omega$·cm is directly formed on the substrate in a simple process with high efficiency, and production yield is significantly improved.

In addition, since a low melting point metal is used, a linear pattern having a width below 100 microns and a resistivity of the order of $10^{-6}$ $\Omega$·cm is achieved in a low temperature process below 450° C., so that deformation of the substrate, on which the pattern is formed, is avoided. Especially, when the linear pattern is formed as an electrode on an incident light surface of a microcrystal/crystal junction type solar cell or an amorphous silicon solar cell, a junction in the solar cell is not destroyed during the formation of the pattern. Since thus formed electrode has a width below 100 microns and a resistivity of the order of $10^{-6}$ $\Omega$·cm, the an effective power generating area of the solar cell is increased and current generated in the active layer is taken out with high efficiency, resulting in significantly improved solar cell characteristics.

In addition, according to the present invention, the tank for keeping the low melting point metal in its fused state and the drawing head for applying the fused metal to the substrate are united, and motion of the unit is controlled by the computer. Therefore, the pattern to be formed and the applying conditions of the fused metal are changed easily and rapidly by the program stored in the computer, with the result that various kinds of linear patterns are formed with high efficiency.

What is claimed is:

1. A method for producing an electrically conduction pattern on a substrate, comprising:
    maintaining a first low melting point metal in a fused state;
    applying, by capillary action, said fused first low melting point metal to a tip of a drawing head disposed close to or in contact with a substrate;
    applying said fused first low melting point metal to the substrate in a first linear pattern including lines having a width less than 100 microns while moving the tip of said drawing head relative to the substrate;
    cooling and solidifying said first low melting point metal in the first linear pattern on the substrate;
    maintaining a second low melting point metal in a fused state, the second low melting point metal having a lower melting point than the first low melting point metal;
    applying, by capillary action, said fused second low melting point metal to the tip of the drawing head disposed close to the substrate;
    applying said fused second low melting point metal to the substrate in a second linear pattern intersecting the first linear pattern; and
    cooling and solidifying said second low melting point metal in the second linear pattern on the substrate.

2. The method of claim 1 including selecting the first and second low melting point metals from the group consisting of In—Sn alloy, In—Pb alloy, and In.

3. The method of claim 1 including mixing metal particles having a higher melting point and a lower resistivity than the first low melting point metal into the first low melting point metal before applying the fused first low melting point metal.

4. The method of claim 3 wherein said metal particles are selected from the group consisting Ag, Au, Cu, and Pt.

5. The method of claim 1 wherein said substrate includes one of an active layer of an incident light surface of a solar cell and a transparent electrode disposed on an active layer of a light incident surface of a solar cell and said first and second linear patterns are part of an electrode.

* * * * *

UNITED STATES PATENT AND TRADEMARK OFFICE
CERTIFICATE OF CORRECTION

PATENT NO. : 5,389,573
DATED : February 14, 1995
INVENTOR(S) : Takushi Itagaki

It is certified that error appears in the above-indentified patent and that said Letters Patent is hereby corrected as shown below:

Column 8, Line 13, change "conduction" to --conducting--.

Signed and Sealed this

Twenty-seventh Day of June, 1995

Attest:

BRUCE LEHMAN

Attesting Officer     Commissioner of Patents and Trademarks